United States Patent
Robinson et al.

(10) Patent No.: US 9,444,504 B1
(45) Date of Patent: Sep. 13, 2016

(54) APPARATUS AND METHOD FOR SELECTIVE SIGNAL CANCELLATION

(71) Applicant: RAYTHEON COMPANY, Waltham, MA (US)

(72) Inventors: Ian S. Robinson, Redondo Beach, CA (US); Daniel Kilfoyle, Falmouth, MA (US); William P. Ballance, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/846,425

(22) Filed: Sep. 4, 2015

(51) Int. Cl.
*H04B 1/10* (2006.01)
*H03M 1/12* (2006.01)

(52) U.S. Cl.
CPC ............ *H04B 1/1036* (2013.01); *H03M 1/12* (2013.01)

(58) Field of Classification Search
USPC ....... 375/130, 345; 341/139, 155; 455/234.1
See application file for complete search history.

(56) References Cited

U.S. PATENT DOCUMENTS

| 6,864,817 | B1* | 3/2005 | Salvi | H03M 3/49 341/139 |
|---|---|---|---|---|
| 2007/0242730 | A1* | 10/2007 | Birru | H04B 1/71637 375/130 |
| 2008/0122674 | A1* | 5/2008 | Tan | G01S 19/37 341/155 |
| 2011/0249184 | A1* | 10/2011 | Elsherif | H04N 5/21 348/572 |
| 2012/0288043 | A1* | 11/2012 | Chen | H04B 1/109 375/345 |
| 2013/0090079 | A1* | 4/2013 | Martin | H03M 1/185 455/234.1 |

* cited by examiner

*Primary Examiner* — Eva Puente
(74) *Attorney, Agent, or Firm* — Lewis Roca Rothgerber Christie LLP (57) ABSTRACT

Method for capturing a high dynamic range signal includes: receiving the wideband analog signal; digitizing the wideband signal by a wideband ADC; detecting N strongest sub-bands in the digitized wideband analog signal; adaptively programming N bandstop filters to block the detected N strongest sub-bands from being digitized by the wideband ADC; adjusting a gain of output signals of the N bandstop filters to amplify said output signals; digitizing the amplified output signals by the wideband ADC to obtain a first digitized signal; adaptively programming N passband filters to pass the detected N strongest sub-bands to N ADCs, respectively; digitizing the detected strongest N sub-band signals output from the N pass-band filters by the respective N ADCs to obtain a plurality of second digitized signals; and processing the first digitized signal and the plurality of second digitized signals to identify any duplicate bands.

20 Claims, 5 Drawing Sheets

APPARATUS AND METHOD FOR SELECTIVE SIGNAL CANCELLATION

FIELD OF THE INVENTION

This invention generally relates to RF receivers and waveform cancellation techniques, and more specifically to an apparatus and method for selective signal cancellation.

BACKGROUND

Radio frequency (RF) communication systems have historically been extremely susceptible to the adverse effects of co-channel interference. For example, co-channel interference is caused by the transmission of a signal from a nearby source on the communications channel of concern. Conventional receivers suffer from the basic inability to accurately distinguish a desired signal from other signals transmitted by an interfering source, especially when the interfering signals are strong compared to the weaker signals to be detected.

Some RF receivers are required to operate over instantaneously wide bandwidths, however, they are limited in performance due to interfering signals in the background or from other systems that are close by. Some applications require detection of weak signals in the presence of strong interfering signals. Generally, as the bandwidth of a signal increases, it becomes more difficult to maintain the dynamic range of the receiver, that is, there is a tradeoff between the bandwidth and dynamic range of a signal.

In conventional telecommunications systems, analog to digital converters (ADCs) must receive and digitally convert RF signals over a given dynamic range of amplitudes. The RF receiver typically first filters the signals to remove unwanted signals and noise outside of the frequency range of interest, particularly to prevent aliasing in the sampling process. Therefore, while ADCs using such signal filtering are suitable for single air interface or single carrier applications, such ADCs are less capable of meeting the stringent requirements of wideband reception systems that receive more than one signal at a time, for example, multi-air interface, multi-carrier systems, such as software-defined radios, which must process RF signals over a large dynamic range. This is because ADC dynamic range is limited especially for wide bandwidths, although higher dynamic range ADCs exist for narrow band operation. Well known (interfering) signals can be cancelled but cancellation can be expensive and is imperfect, introducing artifacts, the lack of which is as important as the improvement in dynamic range obtained. The cost and difficulty increases as the number of interfering signals increases. Often, there may be bands of interfering signals resulting from licensing of spectrum to cell phone providers, TV stations, and other commercial and government entities who radiate many signals in limited bands of the spectrum.

Most of the existing solutions for signal cancellation are for narrow band receivers with extremely narrow band interference. Moreover, some prior systems have modeled steady state interference, used notch filters to block it out, or created feedback loops to adaptively remove signal content. Adaptively removing signals and cancelling signals generally involves delaying the input signal while a cancellation signal is created and applied. The delay introduces high latency to the receiver and is difficult to achieve, especially for wide band signals. Notching filters and other filtering schemes are undesirable and they fail to ensure that the wanted signals are retained for detection.

SUMMARY

In some embodiments, the present invention is a method for capturing a high dynamic range signal. The method includes: receiving the wideband analog signal; digitizing the wideband signal by a wideband analog-to-digital converter (ADC); detecting N strongest sub-bands in the digitized wideband analog signal, where N is an integer greater than or equal to one; adaptively programming N bandstop filters to block the detected N strongest sub-bands from being digitized by the wideband ADC; adjusting a gain of output signals of the N bandstop filters to amplify said output signals; digitizing the amplified output signals by the wideband ADC to obtain a first digitized signal; adaptively programming N passband filters to pass the detected N strongest sub-bands to N ADCs, respectively; digitizing the detected strongest N sub-band signals output from the N pass-band filters by the respective N ADCs to obtain a plurality of second digitized signals; and processing the first digitized signal and the plurality of second digitized signals to identify any duplicate bands.

In some embodiments, the present invention is a method for capturing a wideband analog signal. The method includes: receiving the wideband analog signal; obtaining information about N strongest sub-bands in the received wideband analog signal, where N is an integer greater than or equal to one; bandstop filtering the wideband analog signal to block the N strongest sub-bands from being digitized by a wideband ADC; digitizing the bandstop filtered signals by the wideband ADC to obtain a first digitized signal; passband filtering the received wideband analog signal to pass the N strongest sub-bands to N ADCs, respectively; digitizing the passband filtered N strongest sub-band signals output from the N pass-band filters by the respective N ADCs to obtain a plurality of second digitized signals; and processing the first digitized signal and the plurality of second digitized signals to identify any duplicate bands.

In some embodiments, the present invention is a wideband receiver for capturing a wideband analog signal including: an input port for receiving a wideband analog signal; a wideband analog-to-digital converter (ADC); a processor for detecting N strongest sub-bands in the wideband analog signal, where N is an integer greater than or equal to one; N programmable bandstop filters programmed by the processor to block the detected N strongest sub-bands in the digitized wideband analog signal from being digitized by the wideband ADC; an automatic gain controller (AGC) for adjusting a gain of output signals of the N bandstop filters to amplify said output signals to be digitizing by the wideband ADC to obtain a first digitized signal; N programmable passband filters programmed by the processor to pass the detected N strongest sub-bands; N ADCs for digitizing the detected strongest N sub-band signals output from the N pass-band filters to obtain a plurality of second digitized signals, wherein the processor processes the first digitized signal and the plurality of second digitized signals to identify any duplicate bands; and an output port for outputting the processed signals.

In some embodiments, the present invention is a wideband receiver for capturing a wideband analog signal including: an input port for receiving a wideband analog signal; a wideband analog-to-digital converter (ADC); a memory for storing information about N strongest sub-bands in the received wideband analog signal, where N is an integer greater than or equal to one; a processor for obtaining the stored information; N bandstop filters for blocking the N strongest sub-bands in the digitized wideband analog signal from being digitized by the wideband ADC; an automatic gain controller (AGC) for adjusting a gain of output signals of the N bandstop filters to amplify said output signals to be digitizing by the wideband ADC to obtain a first digitized signal; N passband filters to pass the detected N strongest sub-bands; N ADCs for digitizing the detected strongest N sub-band signals output from the N pass-band filters to obtain a plurality of second digitized signals, wherein the processor processes the first digitized signal and the plurality of second digitized signals to identify any duplicate bands; and an output port for outputting the processed signals.

In some embodiments, the received analog signal may be down converted to an intermediate frequency signal (IF), and detecting N strongest sub-band signals in the IF signal.

DETAILED DESCRIPTION

In some embodiments, the present invention is an RF receiver that receives a wideband signal (e.g. 4 GHz of spectrum). The receiver then detects the upper dynamic range of the wideband signal and identifies the N strongest sub-band signals (N being a design choice), adaptively sets N analog filters to block those signals from going to the wideband portion of the receiver, while at the same time adaptively sets N other analog filters to pass the same N strongest sub-bands (signal bands) to high dynamic range detectors employing N high dynamic range ADCs. A plurality of programmable adaptive filters in the receiver block the stronger signals from reaching a wideband ADC/sampler. The digital data in each N sub-band is sampled and processed for detection by a processor. Having blocked the N strongest sub-bands, the wideband signal reaching the ADC (sampler) has reduced dynamic range. The gain of this wideband signal is controlled and increased by an automatic gain controller (AGC) so the lower portion of the wideband signal is sampled by the wideband ADC and may be detected above the noise floor of ADC. This path is sampled without any additional delaying the wideband signal to create a cancellation signal. All or some of the sampled signals may then be processed (reconstructed) to form a single digital discrete time representation of the received RF signal. In other words, the present invention removes the "chunks" of spectrum with the strongest signals for separate processing and thus enables detection of the weaker signals throughout the wideband signal in one portion of the receiver while detecting both stronger and weaker signals in the N sub-bands, in another portion of the receiver.

Figure 1:
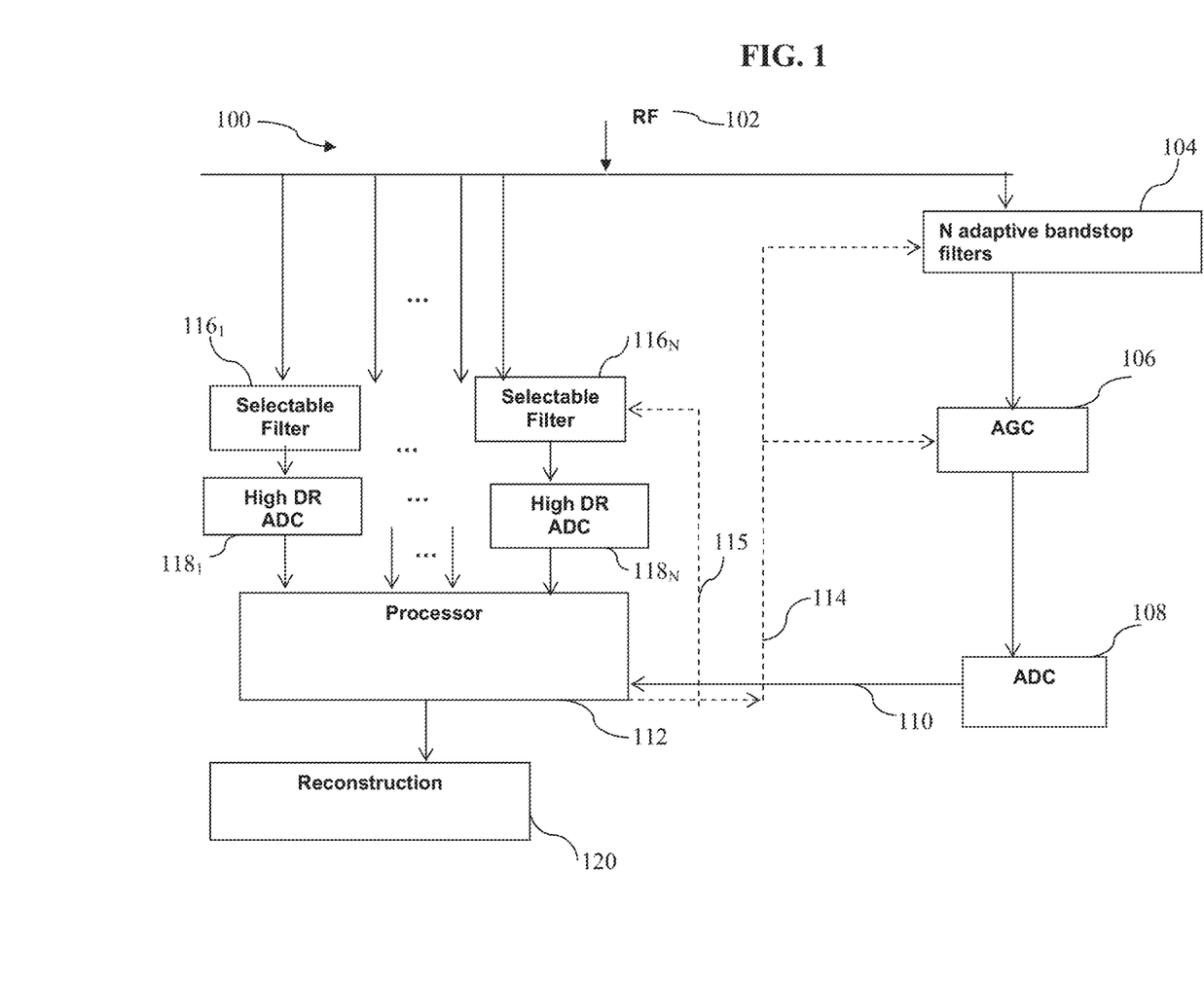
FIG. 1 is a block diagram of a circuit for selective signal cancellation, according to some embodiments of the present invention.

FIG. 1 is an exemplary block diagram of a circuit for selective signal cancellation, according to some embodiments of the present invention. In some embodiments, the circuit is party of a wide band receiver. As shown, a wideband analog RF signal 102 is received by an input port from a communication channel, for example, from an antenna. A processor 112 detects N strongest signal bands from the wideband analog RF signal 102. In some embodiments, N adaptive bandstop filters 104 are initially set e.g., as their initial condition) to pass the received wideband analog RF signal 102 unfiltered and the AGC 106 is set to an initial gain (determined by the system requirements) to pass the input signal undisturbed to a wideband ADC 108. The wideband ADC samples and digitizes the wideband signal and feeds the digitized data 110 to the processor 112 to determine N strongest signal bands from the input signal.

For example, the processor may perform a Fast Fourier Transform (FFT) to provide amplitude vs. frequency information. Then, one of several known methods may be used to compute the total energy in the bands. For example, a histogram of fixed width sub-bands may be produced and the largest N bands are selected by the processor. The fixed width of the sub-bands will be a fraction of the bandwidth accepted by the N high dynamic range ADCs. Further improvements in this process may be achieved by a second method that tests whether some of the sub-bands can be combined but still fit within the bandwidth of the N ADCs. If no sub-bands can be combined, the N sub-bands containing the strongest signals are used as the N bands. Otherwise, the sub-bands that can be combined are combined together and the next largest band from the histogram is selected. This selected next largest band is also tested for combining with other results from the histogram until no more sub-band combining can be accomplished.

The processor then programs N adaptive bandstop filters 104 to block the detected N strongest signal bands, by the control signal 114. Processor 112 is capable of programming the adaptive bandstop filters 104 and the selectable passband filters $116_1$ to $116_N$ via control signals 114 and 115, respectively.

Figure 2A:
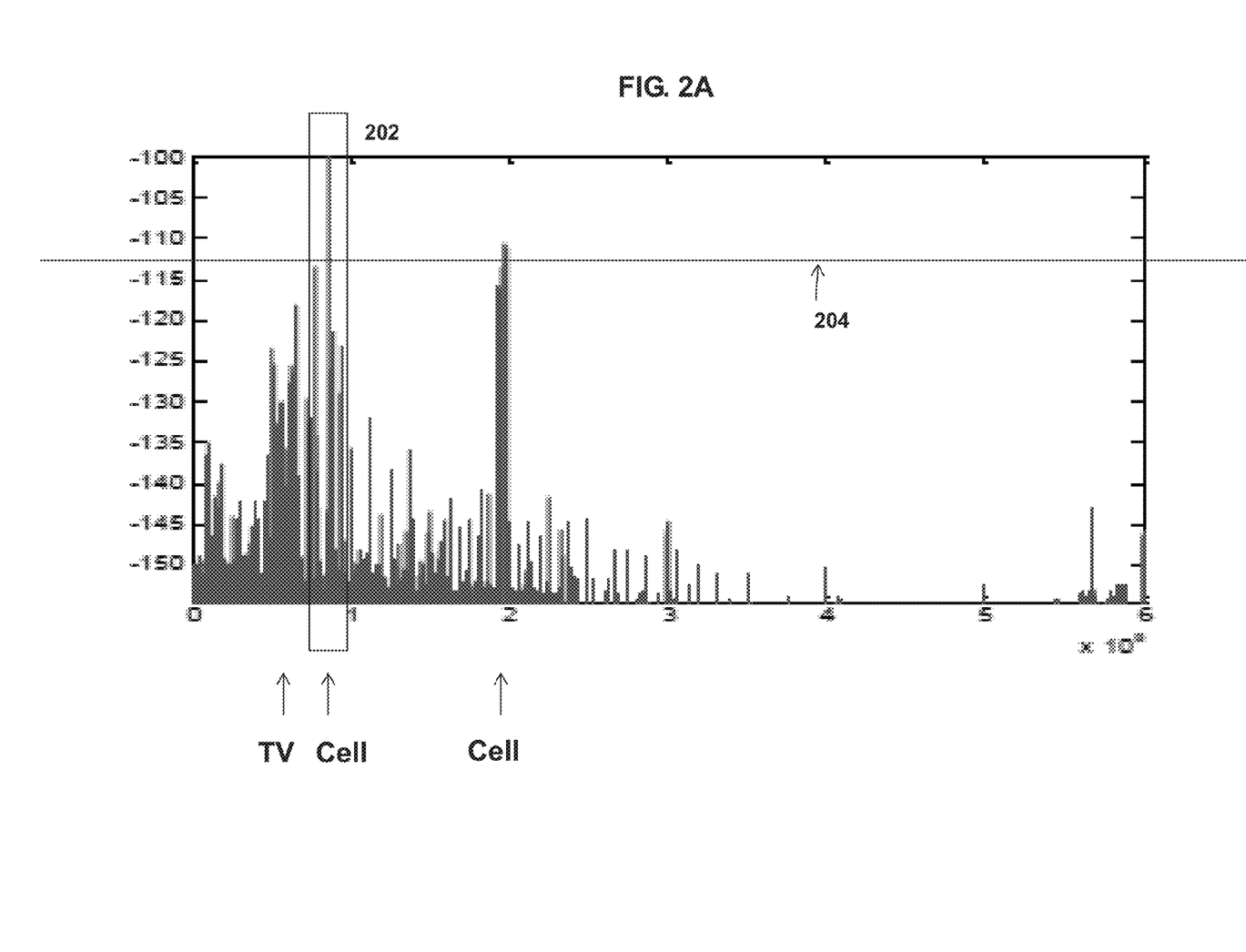
FIGS. 2A and 2B show dynamic range plots when one or three sub-bands are removed, respectively, according to some embodiments of the present invention.
Figure 2B:
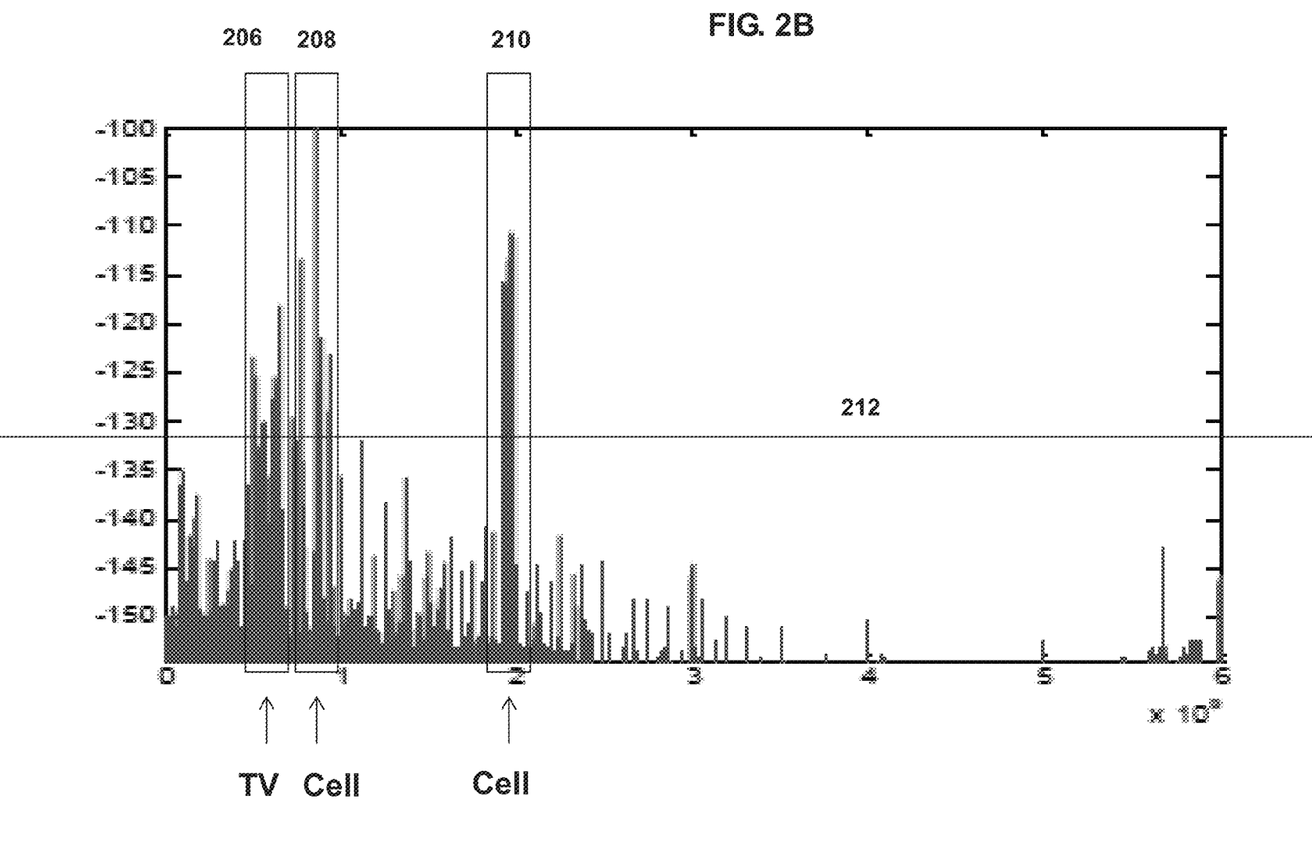

The output of the N bandstop filters 104 is still a wideband signal, but with a reduced dynamic range. For example, as shown in FIG. 2A, removing one sub-band for a 4 GHz RF signal would result in a reduced wideband dynamic range of 12 dB. While removing three sub-bands would result in a reduced wideband dynamic range of 32 dB, as depicted in FIG. 2B. This enables signal detection over wideband. The resulting signal still has the same total bandwidth as the signal before the bandstop filters removed the N strongest sub-bands. However, since the total dynamic range of the resulting signal is reduced, it is feasible to digitize the remaining signal with a single wideband ADC 108. Before such digitization is performed by the single wideband ADC 108, the gain of the AGC 106 is adjusted (increased, if needed) so that the remaining signal is above the noise floor of the wideband ADC 108. However, some wanted signals may also be present in the blocked bands. For this reason, bandpass filters $116_1$ to $116_N$ are adaptively set to transmit the N blocked bands to N higher dynamic range ADCs $118_1$ to $118_N$. ADCs of higher dynamic range are readily available in the much narrower bandwidths of the bandpass filters.

The processor programs the N selectable bandpass filters $116_1$ to $116_N$ via the control signal 115 to pass the N strongest signal bands since the strongest signal bands may include wanted signals and/or because some wanted signals may also be present in the blocked bands that are blocked by the N bandstop filters 104.

The passed-though N strongest signal bands are narrow band and may contain weak signals of interest and thus requiring high dynamic range electronics to capture them. These signals are then input to N high dynamic range ADCs $118_1$ to $118_N$, which detect any wanted signals (e.g. agile frequency signals) in the passed-through N strongest signal bands, even with high level of interference. Strong signal bands may be from background emitters, other RF transmitters, strong wanted signals, or the like. The outputs of the N high dynamic range ADCs $118_1$ to $118_N$ are then input to the processor for further processing. The processor is capable of analyzing the digitize signals separately and outputting them to an output port for further processing and/or analyzing for different applications. For example, it computes the amplitude and/or power and possibly the phase of each signal to recognize different types of radar emitters or communication systems.

In some embodiments, optional N AGCs may be included before the N high dynamic range ADCs $118_1$ to $118_N$ and after or before the N selectable bandpass filters $116_1$ to $116_N$ to also adjust the gains of the N signals. In some embodiments, the processor may adaptively adjust the sampling rate of one or more of the N high dynamic range ADCs $118_1$ to $118_N$ to "bandpass sample" the output signal(s) to recover the one or more signals at or near baseband, since the ADCs $118_1$ to $118_N$ are narrow band. This may be done with adjusting the clock rate to the one or more of the ADCs $118_1$ to $118_N$. In some embodiments, in addition to or in lieu of the sampling rate adjustment, one or more (up to N) frequency down converters may be placed before the ADCs $118_1$ to $118_N$ to down convert their respective input signals.

Having computed the amplitude (and phase of all signals present), an optional combiner/reconstruction hardware/circuit 102 may concatenate the ensemble signals into a single set of signals, amplitudes and phases, depending on the application. In some embodiments, some signals will show up in more than one ADC output. In these cases, the reconstruction hardware selects a best signal candidate based on the SNR of the signals. The reconstruction hardware may compute a weighted average based on the SNRs of the channels. The reconstruction hardware may also adjust the amplitude and/or phase of the signals arriving through different channels to normalize any differences in the respective channel gains and/or time delays. If the phases of the signals are computed, the time delay of each path from, for example, an antenna to each ADC for each adaptive filter setting needs to be calibrated and then a calibration correction applied to each measured phase to account for any timing differences through the system.

In some embodiments, the reconstruction hardware combines some or all of the sub-bands into a single wideband signal (e.g. the return of a wide band chirped signal used for ranging or synthetic aperture radar may be split among multiple channels) for further processing and/or use. In some embodiments, the combining/reconstruction may be performed by the processor, therefore, eliminating the need for a hardware/circuit implementation of the combining/reconstruction. In some embodiments, the combining/reconstruction hardware may be a de-channelizer circuit. The processor also monitors the outputs of the N high dynamic range ADCs $118_1$ to $118_N$ for saturation or changes in amplitude of the signals defining the N strongest bands. The processor may select an update to the N strongest bands or the processor may command a reset to the process, and the detection of the N strongest bands and programming of all the filters are performed again. The processor may also monitor the digitized data to resolve for any duplication in the bands from the outputs of the wideband ADC 108 and the N high dynamic range ADCs $118_1$ to $118_N$.

In some embodiments, the wideband analog RF signal 102 is down converted by a frequency down converter (not shown) to an intermediate frequency signal IF, before it is input to the processor 112, the N selectable bandpass filters $116_1$ to $116_N$, and the N bandstop filters 104. For example, if the input signal is 0-4 GHz and N equals to 2, the two strongest sub-bands cover 1-1.1 GHz and 3.0-3.1 GHz. Each bandpass filter outputs a signal of 100 MHz wide. If these signals are downconverted, an ADC that samples at approximately 200 mega-samples/second (twice the highest down-converted frequency) may be utilized, the RF input circuits of which can only accept 0-100 MHz.

However, if the signals are not downconverted, some circuitry and cost needed for down-conversion are saved by using the known scheme of bandpass sampling. Bandpass sampling operates at or near twice the bandwidth of the bandpass signal, rather than twice its highest frequency. However, the bandpass scheme requires an ADC with 50-100% higher sampling rate and an RF input circuit that covers the entire wideband (0-4 GHz in this case), which is noisier and more expensive. Also, the bandpass scheme may require two or more clock rates to ensure every signal may be sampled according to the rules in the attachment.

That is, the circuits according to the present invention remove signals in the analog domain from the wideband signal so that they can be sampled/digitized with lower dynamic range parts (e.g., ADCs), however, the invention retains the removed sub-bands, which may include interfering signals, wanted signals, or both. The circuits of the embodiments of the invention do not need any delay line, or high-speed DACs. In contrast, the conventional approaches described briefly in the background section require delay lines and high speed DACs to create cancellation signals and may also require de-channelizers (also called inverse channelizers) to create cancellation signals for cancelling more than one interferer.

FIGS. 2A and 2B show dynamic range plots when one or three sub-bands are removed, respectively, according to some embodiments of the present invention. As shown in FIG. 2A, one sub-band 202 covers the strongest background signals, which may be television and cellular signals, for example. Removing this sub-band saves 12 dB of dynamic range, as depicted in FIG. 2A. The remaining signals stay below the line 204. The strong signals could be wanted signals, interfering signals, and/or other RF (background) signals.

As illustrated in FIG. 2B, three sub-bands 206, 208 and 210 cover the strongest background signals, which may be television and cellular signals, for example. Removing these three sub-bands saves 32 dB of dynamic range, as shown in FIG. 2B. The remaining signals stay below the line 212.

Figure 3:
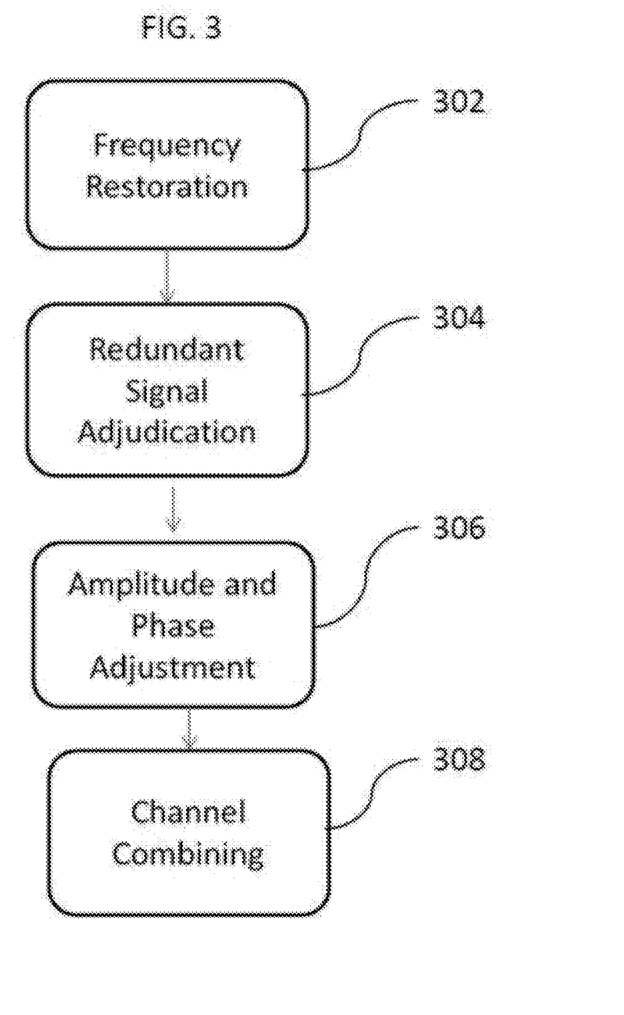
FIG. 3 is a block diagram of an exemplary hardware implementation for reconstructing digital sub-band signals, according to some embodiments of the present invention.

FIG. 3 is a block diagram of an exemplary hardware implementation for reconstructing digital sub-band signals, according to some embodiments of the present invention. In many cases, the output of the processor may be adequate for many purposes including signals detection and characterization, demodulation, direct finding, and more. However, in some applications, it is necessary to reconstruct the digital signals arriving from one or more channels into a complete wide band signal. In these cases, reconstruction hardware reconstructs the signal. A first block of frequency restoration hardware 302 restores the center frequency of each band of signals to match those frequency of their origin. For example, if bandpass sampling, which is a form of under-sampling, is applied the signals are passed through an analog bandpass filters and then sampled. These sampled signals may be aliased to a lower frequency band and also may have their order reversed. This process is deterministic and the sampling process must be reversed to reconstruct the signals. This may be accomplished by oversampling/upsampling the signals and passing them through a digital bandpass filter whose passband parameters match those of the filter used in the bandpass sampling. If signal down-conversion is applied, then an equivalent up-conversion is also applied. That is, if downconversion is used, the sampled signals are offset from their original frequency and compensation is applied in the form of upconversion or inverse channelization.

A redundant signal adjudication hardware 304 may adjudicate any redundant signals in two or more channels of data by selecting the signal with the higher signal to noise ratio, or by taking a weighted average of the redundant signals, weighted by their respective signal to noise. In some embodiments, the spectrum of data from each ADC is measured. There may be overlapping results for regions of overlap, in which case, the signals may be considered as a redundant signal. In some embodiments, a threshold may be applied to signals in the potential overlap region and if signals from two or more ADCs are above the threshold, there are redundant signals.

In some embodiments, prior to any combining, an amplitude and phase adjustment circuit 306 may adjust the amplitude and or phase of signals arriving from different channels to account for gain and/or group delay differences in the respective channels. For example, if the reconstructed signal is to be processed in some coherent fashion (e.g. pulse compression), the data needs to be normalized first for any differences in gain or group delay occurring in the respective channels.

Finally, a channel combining circuit 308 may combine the data from the respective channels. Combining may be accomplished by adding digital signals in the time domain or concatenation of Fast Fourier Transform (FFT) results in the frequency domain. The redundant signals may be used as calibration signals to compute adjustments for the respective channels. Alternatively, a dedicated set of calibration signals, spanning the entire bandwidth of the wideband ADC may be employed. For example, a chirp signal spanning the band would be inserted as an RF signal. This chirp signal has known amplitude (uniform at some level) and is modulated from a beginning frequency to an end frequency. The measured output of the invention may deviate from a chirp signal due to differences in gain or group delay as a function of frequency in the respective channels. These difference may be determined by comparing the measured outputs to the known input and a set of corrections determined.

Figure 4:
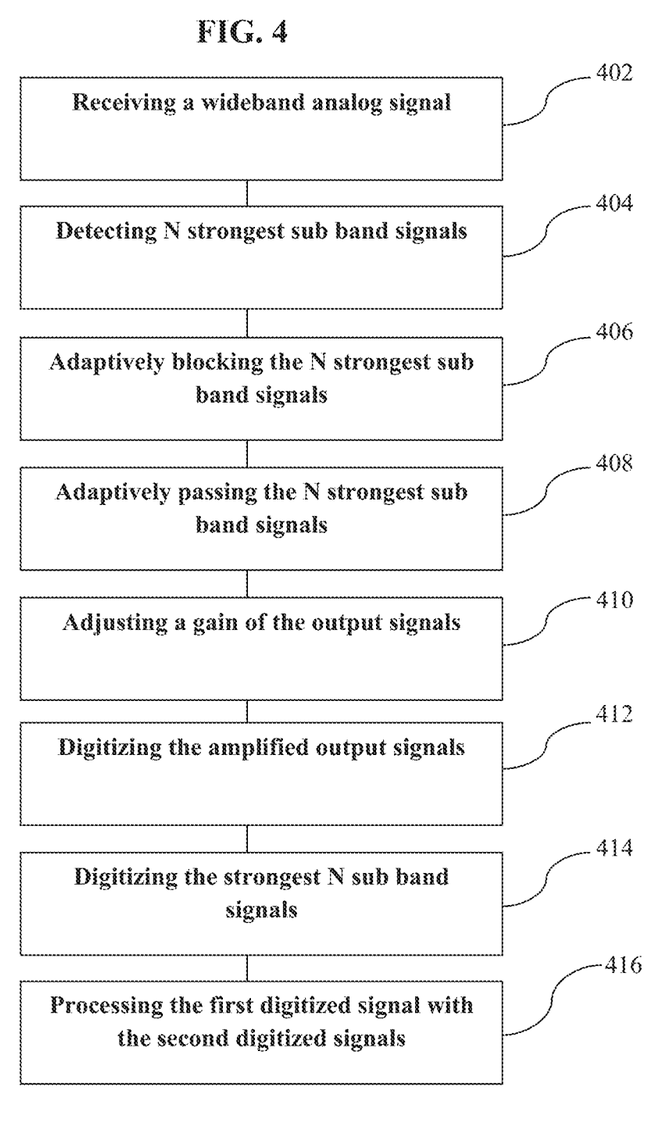
FIG. 4 is a process flow for processing a high dynamic range signal, according to some embodiments of the present invention.

FIG. 4 is an exemplary process flow for processing or capturing a high dynamic range signal, according to some embodiments of the present invention. As shown in bock 402, a wideband analog signal (for example, a 4 GHz signal) is received. The input signal may be received from a radar, a radio, commercial broadcast, navigation systems, signals from ground, air, sea, or neighboring platforms.

In block 404, N strongest sub-band signals in the received analog signal are detected, for example, by a processor. For instance, the processor may initially set the gain of the AGC to one (or its initial gain). Accordingly, the output of the N bandstop filters is passed to the wideband ADC to the wideband AGC. The wideband ADC samples and digitizes the wideband signal and feeds the digitized data to the processor. The N strongest N bands are identified by the processor and the dynamic range of the removed signals is stored in (a memory of) the processor. The N bandstop filters 104 are then adaptively programmed to block the detected N strongest sub-band signals, in block 406. For example, the bandstop filters are programmed by a processor to block signals at certain frequencies. The filters may be voltage controlled or digitally controlled. The filters themselves could be dielectric filters, surface acoustic wave filters, discrete-time analog signal processor chips, or the like. Likewise, N pass-band filters are adaptively programmed (for example, by a processor) to pass the detected N strongest sub-band signals to N ADCs, respectively, in block 408. The outputs of the bandstop filters 104 and the AGC 106 are a single streamed signal.

The gain of the output signals of the multiple bandstop filters is adjusted (increased) to amplify the output signals based on the range of the removed signals, so that much weaker signals, not blocked by the bandstop filters, can arrive at ADC 108 above the noise floor of that ADC, in block 410. For example, a processor may provide a feedback control to an AGC to increase its gain. This way, the weak (wanted) signals are amplified before they are sampled. In block 412, the amplified output signals are digitized to obtain a first (streamed) digitized signal. Similarly, the detected strongest N sub-band signals output from the N pass-band filters are digitized by respective N ADCs to obtain a plurality of second digitized signals, in block 414. In some embodiments, if information about the N strongest sub-bands is known a priori, the relevant N strongest bands detection processes may be omitted.

In block 416, the first digitized signal and the plurality of second digitized signals are processed or monitored to identify any missing or duplicate bands and/or to ensure that the wideband ADC 108 is not saturated. If the wideband ADC 108 is saturated, the process is reset and starts again from block 402. Depending on the application, each or some of the resulting signals are further processed, with or without combining them together. In some embodiments, some or all of the first digitized signal and the plurality of second digitized signals are combined to obtain a digital signal which represents (to some extend) the wideband analog signal. All or some of the digitized signals may be combined, depending on the required application.

This way, the present invention splits the wideband analog signal into N sub-bands, where N is a much smaller number than dividing the entire wideband into sub-bands, and a wideband signal absent the N sub-bands. The present invention then removes signals in the analog domain from the wideband signal so that it may be sampled/digitized with lower dynamic range components (e.g., ADCs), but retains the removed sub-bands. The retained sub-bands may be interfering signals, wanted signals, or both. That is, the invention preserves the ability to detect weak wanted signals in the removed bands, while improving small signal detection in the wideband path. The invention analyses these sub-bands separately or adds them back to the digital wideband signal for use, for example in a common analysis tool. No signal modeling is required to remove large interfering signals.

The invention does not need to specifically need to measure, characterize, or be informed of the frequency or amplitude of any specific signals, rather, it simply measures the strongest signals in the N sub-bands. Moreover, weak wanted signals very close to strong interfering signals or interoperable signals are sampled at extreme dynamic range and thus are not removed by accident. This way, the weak wanted signals may be observed near strong interfering signals. If a priori information on the N strongest sub-bands is available then the bandpass filters, bandstop filters, and AGC may be pre-set with their parameters according to the priori information on the N strongest sub-bands.

In some embodiments, in case of known information about the priori information on the N strongest sub-bands, the relevant detection related processes and circuits in FIGS. 1 and 3 may be omitted. Moreover, in those cases, the bandstop filters 104 and the bandpass filters $118_1$ to $118_N$ may be non-programmable filters resulting in a less complex and cheaper circuit/process.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended claims.

What is claimed is:

1. A method for processing a wideband analog signal, the method comprising:
   receiving the wideband analog signal;
   digitizing the wideband analog signal by a wideband analog-to-digital converter (ADC);
   detecting N strongest sub-bands in the digitized wideband analog signal, where N is an integer greater than or equal to one;
   adaptively programming N bandstop filters to block the detected N strongest sub-bands from being digitized by the wideband ADC;
   adjusting a gain of output signals of the N bandstop filters to amplify said output signals;
   digitizing the amplified output signals by the wideband ADC to obtain a first digitized signal;
   adaptively programming N passband filters to pass the detected N strongest sub-bands to N ADCs, respectively;
   digitizing signals of the detected N strongest sub-bands output from the N pass-band filters by a respective one of the N ADCs to obtain a plurality of second digitized signals; and
   processing the first digitized signal and the plurality of second digitized signals to identify any duplicate bands.

2. The method of claim 1, further comprising combining the first digitized signal with the plurality of second digitized signals to obtain a digital signal which represents all or a portion of the received wideband analog signal.

3. The method of claim 2, wherein the combining comprises concatenating the first digitized signal with the plurality of second digitized signals to obtain a digital signal which represents all or a portion of the received wideband analog signal.

4. The method of claim 2, wherein the combining comprises adjusting a center frequency of each of the first digitized signal and the plurality of second digitized signals to match the original wideband analog signal.

5. The method of claim 1, further comprising down-converting the received analog signal to an intermediate frequency signal (IF), and detecting N strongest sub-band signals in the IF signal.

6. The method of claim 1, further comprising adaptively adjusting a sampling rate of one or more of the N ADCs to bandpass sample one or more respective signals to recover the one or more respective signals at or near baseband.

7. The method of claim 6, further comprising down converting input signals at inputs of each of the N ADCs.

8. A method for capturing a wideband analog signal, the method comprising:
   receiving the wideband analog signal;
   obtaining information about N strongest sub-bands in the received wideband analog signal, where N is an integer greater than or equal to one;
   bandstop filtering the wideband analog signal to block the N strongest sub-bands from being digitized by a wideband ADC;
   digitizing the bandstop filtered signals by the wideband ADC to obtain a first digitized signal;
   passband filtering the received wideband analog signal to pass the N strongest sub-bands to N ADCs, respectively;
   digitizing signals of the passband filtered N strongest sub-bands output from the N pass-band filters by a respective one of the N ADCs to obtain a plurality of second digitized signals; and
   processing the first digitized signal and the plurality of second digitized signals to identify any duplicate bands.

9. The method of claim 8, further comprising combining the first digitized signal with the plurality of second digitized signals to obtain a digital signal which represents all or a portion of the received wideband analog signal.

10. The method of claim 8, further comprising down-converting the received analog signal to an intermediate frequency signal (IF), and detecting N strongest sub-band signals in the IF signal.

11. The method of claim 8, further comprising adaptively adjusting a sampling rate of one or more of the N ADCs to bandpass sample one or more respective signals to recover the one or more respective signals at or near baseband.

12. A wideband receiver for capturing a wideband analog signal comprising:
   an input port for receiving a wideband analog signal;
   a wideband analog-to-digital converter (ADC) for digitizing the received wideband analog signal;
   a processor for detecting N strongest sub-bands in the wideband analog signal, where N is an integer greater than or equal to one;
   N programmable bandstop filters programmed by the processor to block the detected N strongest sub-bands in the digitized wideband analog signal from being digitized by the wideband ADC;
   an automatic gain controller (AGC) for adjusting a gain of output signals of the N bandstop filters to amplify said output signals to be digitizing by the wideband ADC to obtain a first digitized signal;
   N programmable passband filters programmed by the processor to pass the detected N strongest sub-bands;
   N ADCs for digitizing signals of the detected N strongest sub-bands output from the N pass-band filters, respectively to obtain a plurality of second digitized signals, wherein the processor processes the first digitized signal and the plurality of second digitized signals to identify any duplicate bands; and
   an output port for outputting the signals processed by the processor.

13. The wideband receiver of claim 12, further comprising a reconstruction circuit for combining the first digitized signal with the plurality of second digitized signals to obtain a digital signal which represents all or a portion of the received wideband analog signal.

14. The wideband receiver of claim 13, wherein the reconstruction circuit is a de-channelizer circuit.

15. The wideband receiver of claim 12, further comprising a down converter for down-converting the received analog signal to an intermediate frequency signal (IF), wherein the N strongest sub-band signals are detected in the IF signal.

16. The wideband receiver of claim 12, further comprising a plurality of down converters for down-converting input signals to the N ADCs to an intermediate frequency signal (IF), wherein the N ADC digitize the IF signals.

17. The wideband receiver of claim 12, wherein the processor adaptively adjusts a sampling rate of one or more of the N ADCs to bandpass sample one or more respective signals to recover the one or more respective signals at or near baseband.

18. A wideband receiver for capturing a wideband analog signal comprising:
- an input port for receiving a wideband analog signal;
- a wideband analog-to-digital converter (ADC) for digitizing the received wideband analog signal;
- a memory for storing information about N strongest sub-bands in the received wideband analog signal, where N is an integer greater than or equal to one;
- a processor for obtaining the stored information;
- N bandstop filters for blocking the N strongest sub-bands in the digitized wideband analog signal from being digitized by the wideband ADC;
- an automatic gain controller (AGC) for adjusting a gain of output signals of the N bandstop filters to amplify said output signals to be digitizing by the wideband ADC to obtain a first digitized signal;
- N passband filters to pass the detected N strongest sub-bands;
- N ADCs for digitizing signals of the detected N strongest sub-bands output from the N pass-band filters, respectively to obtain a plurality of second digitized signals, wherein the processor processes the first digitized signal and the plurality of second digitized signals to identify any duplicate bands; and
- an output port for outputting the signals processed by the processor.

19. The wideband receiver of claim 18, further comprising a reconstruction circuit for combining the first digitized signal with the plurality of second digitized signals to obtain a digital signal which represents all or a portion of the received wideband analog signal.

20. The wideband receiver of claim 18, further comprising a down converter for down-converting the received analog signal to an intermediate frequency signal (IF), wherein the N strongest sub-band signals are detected in the IF signal.

\* \* \* \* \*